(12) United States Patent
Murakata

(10) Patent No.: US 9,161,467 B2
(45) Date of Patent: Oct. 13, 2015

(54) ELECTRONIC DEVICE

(71) Applicant: Panasonic Corporation, Osaka (JP)

(72) Inventor: Masato Murakata, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/928,772

(22) Filed: Jun. 27, 2013

(65) Prior Publication Data

US 2013/0286569 A1 Oct. 31, 2013

Related U.S. Application Data

(63) Continuation of application No. 13/170,521, filed on Jun. 28, 2011, now Pat. No. 8,611,073, which is a continuation of application No. 12/396,677, filed on Mar. 3, 2009, now Pat. No. 8,045,323.

(30) Foreign Application Priority Data

Mar. 3, 2008 (JP) ................................. 2008-051780

(51) Int. Cl.
*H05K 5/03* (2006.01)
*H05K 5/00* (2006.01)
(Continued)

(52) U.S. Cl.
CPC ................ *H05K 5/03* (2013.01); *H05K 5/0086* (2013.01); *H05K 5/0239* (2013.01); *H05K 5/06* (2013.01); *H01M 2/1022* (2013.01)

(58) Field of Classification Search
CPC ..... G06F 1/1679; G06F 1/1613; G06F 1/181; G06F 1/203; G06F 1/1656; G06F 1/1626; G06F 1/1601; G06F 2200/1633; G06F 1/1637; G06F 1/1628; G06F 1/1633; G06F 1/1616; G06F 1/1635; G06F 1/1632; G06F 2200/1612; G06F 3/1446; H05K 5/0221; H05K 5/0239; H05K 5/0013; H05K 5/0226; H05K 5/061; H05K 5/0017; H05K 5/0217; H05K 5/0004; H05K 5/0208; H05K 5/06; H05K 5/0086; H05K 5/03; H01M 2/1022
USPC .......... 361/724–727, 679.26, 679.21, 679.08, 361/679.55–679.58, 679.01, 679.02; 455/575.1–575.4; 341/22–33; 400/472–496; 345/168–172; 220/833, 220/826, 811
See application file for complete search history.

(56) References Cited

U.S. PATENT DOCUMENTS 5,002,184 A     3/1991   Lloyd
5,155,659 A * 10/1992   Kunert .................... 361/679.56
(Continued)

FOREIGN PATENT DOCUMENTS

EP     09 15 4099     6/2010
JP     07-232754 A     9/1995
(Continued)

*Primary Examiner* — Anthony Haughton
*Assistant Examiner* — Ingrid Wright
(74) *Attorney, Agent, or Firm* — McDermott Will & Emery LLP

(57) ABSTRACT

An electronic device has an opening in a case, a lid member that includes a first lid member having a pair of first engaging sections for putting a lid on the opening at its both ends, a second lid member that has a pair of second engaging sections engaging with the first engaging sections and slides on a main surface of the first lid member, and a projection disposed at an end of the sliding direction of the second lid member. The case has an engaging hole engaging with the projection disposed on the second lid member.

12 Claims, 8 Drawing Sheets

(51) Int. Cl.
*H05K 5/02* (2006.01)
*H05K 5/06* (2006.01)
*H01M 2/10* (2006.01)

(56) References Cited

U.S. PATENT DOCUMENTS

| | | | |
|---|---|---|---|
| 5,484,063 A | 1/1996 | Cuccio et al. | |
| 5,786,106 A | 7/1998 | Armani | |
| 5,793,619 A | 8/1998 | Deguchi | |
| 5,963,422 A * | 10/1999 | Golobay et al. | 361/679.57 |
| 7,075,781 B2 * | 7/2006 | Peng | 361/679.55 |
| 7,325,846 B2 * | 2/2008 | Smith et al. | 292/336.3 |
| 2004/0224556 A1 * | 11/2004 | Qin et al. | 439/500 |
| 2006/0234545 A1 | 10/2006 | Shi et al. | |
| 2008/0291641 A1 | 11/2008 | Sheng | |
| 2009/0008947 A1 | 1/2009 | Chien et al. | |
| 2009/0070958 A1 | 3/2009 | Chien | |
| 2009/0219676 A1 * | 9/2009 | Murakata | 361/679.01 |

FOREIGN PATENT DOCUMENTS

| | | |
|---|---|---|
| JP | 10-069895 A | 3/1998 |
| JP | 11-185720 A | 7/1999 |
| JP | 2000-164184 A | 6/2000 |
| JP | 2001-021979 A | 1/2001 |
| JP | 2002-176481 A | 6/2002 |
| JP | 2003-142841 A | 5/2003 |
| JP | 2005-347432 A | 12/2005 |
| JP | 2006-252969 A | 9/2006 |
| JP | 2007-157663 A | 6/2007 |
| JP | 2008-004348 A | 1/2008 |

* cited by examiner

ELECTRONIC DEVICE

This application is a continuation of U.S. patent application Ser. No. 13/170,521, filed Jun. 28, 2011, which is a continuation of U.S. Pat. No. 8,045,323 B2, issued Oct. 25, 2011, the entire disclosure of which is incorporated herein by reference.

BACKGROUND OF THE INVENTION

1. Field of the Invention

The present invention relates to a lid member for putting a lid on a battery storage section, a recording medium storage section, or an external connection terminal storage section of an electronic device such as a notebook computer, and to an electronic device using the lid member, especially relates to a lid member allowing certain water proof and dust proof and to an electronic device using the lid member.

2. Background Art

Recently, electronic devices having high portability have become widespread, and are used very often not only in doors but also out of doors. Therefore, the electronic devices have been demanded to have vibration resistance and impact resistance against carrying or fall and have environmental resistance against temperature/humidity variation of the ambient environment. Especially, even notebook computers have been more frequently used on the condition of a tough ambient environment such as the outdoors or construction sites, and certain locking performance considering the environmental resistance has been demanded.

An electronic device such as a portable notebook computer has a battery storage section, a recording medium storage section, or an external connection terminal storage section. The electronic device is usually carried out while the lid is put on it and closed by the lid member, and the lid is opened in order to replace the recording medium or the battery for information processing regardless of indoors or outdoors and in order to connect an external device to the external connection terminal.

Examples where the locking structures of various storage sections of such an electronic device are improved to secure the water proof are disclosed in Japanese Patent Unexamined Publications No. 2001-21979, No. 2005-347432, No. 2003-142841, and No. 2002-176481.

In all of the above-mentioned documents, however, a packing made of an elastic member is disposed in a lid member, and the lid member is fixed to an electronic device body through a locking claw that is made of a material different from that of the case of the electronic device. In such a structure, disadvantageously, a difference in expansion/contraction rate occurs between materials dependently on the ambient environment such as temperature variation and hence sufficient locking performance cannot be secured. Uniform pressing force cannot be applied to the packing dependently on the layout of the locking claw, so that the essential function of the lid member, namely putting a lid, becomes insufficient, and the water proof and dust proof cannot be performed.

Also in a structure where the packing and the lid member are integrated and simultaneously moved and the lid member is locked to the case of the electronic device, the difference in expansion/contraction rate between the packing and the lid member is apt to cause degradation of the packing, disadvantageously.

SUMMARY OF THE INVENTION

The present invention addresses these problems, and provides a lid member that has a certain locking function having high environmental resistance against temperature/humidity variation or the like of an ambient environment and high dust proof performance, and an electronic device using the lid member.

The lid member includes a first lid member having a pair of first engaging sections at its both ends, a second lid member that has a pair of second engaging sections engaging with the first engaging sections and slides on a main surface of the first lid member, and a projection disposed at an end of the sliding direction of the second lid member.

The electronic device has an opening in a case, and a lid member that includes a first lid member having a pair of first engaging sections at its both ends for putting a lid on the opening, a second lid member that has a pair of second engaging sections engaging with the first engaging sections and slides on a main surface of the first lid member, and a projection disposed at an end of the sliding direction of the second lid member. The case of the electronic device has an engaging hole with which the projection disposed on the second lid member engages.

DETAILED DESCRIPTION OF THE INVENTION

Exemplary embodiments of the present invention will be hereinafter described in detail with reference to the accompanying drawings.

(First Exemplary Embodiment)

Figure 1:
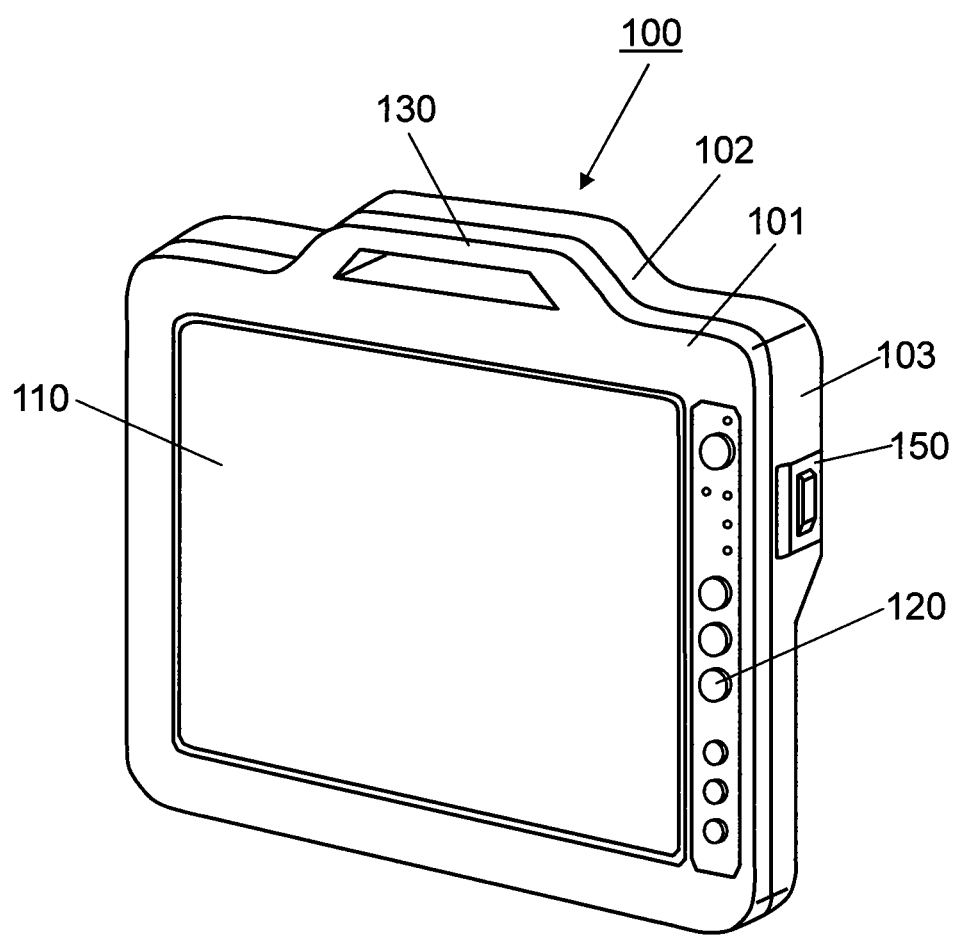
FIG. 1 is a perspective view from the front side of a navigation system (hereinafter referred to as "NAVI") as an electronic device in accordance with a first exemplary embodiment of the present invention.
Figure 2:
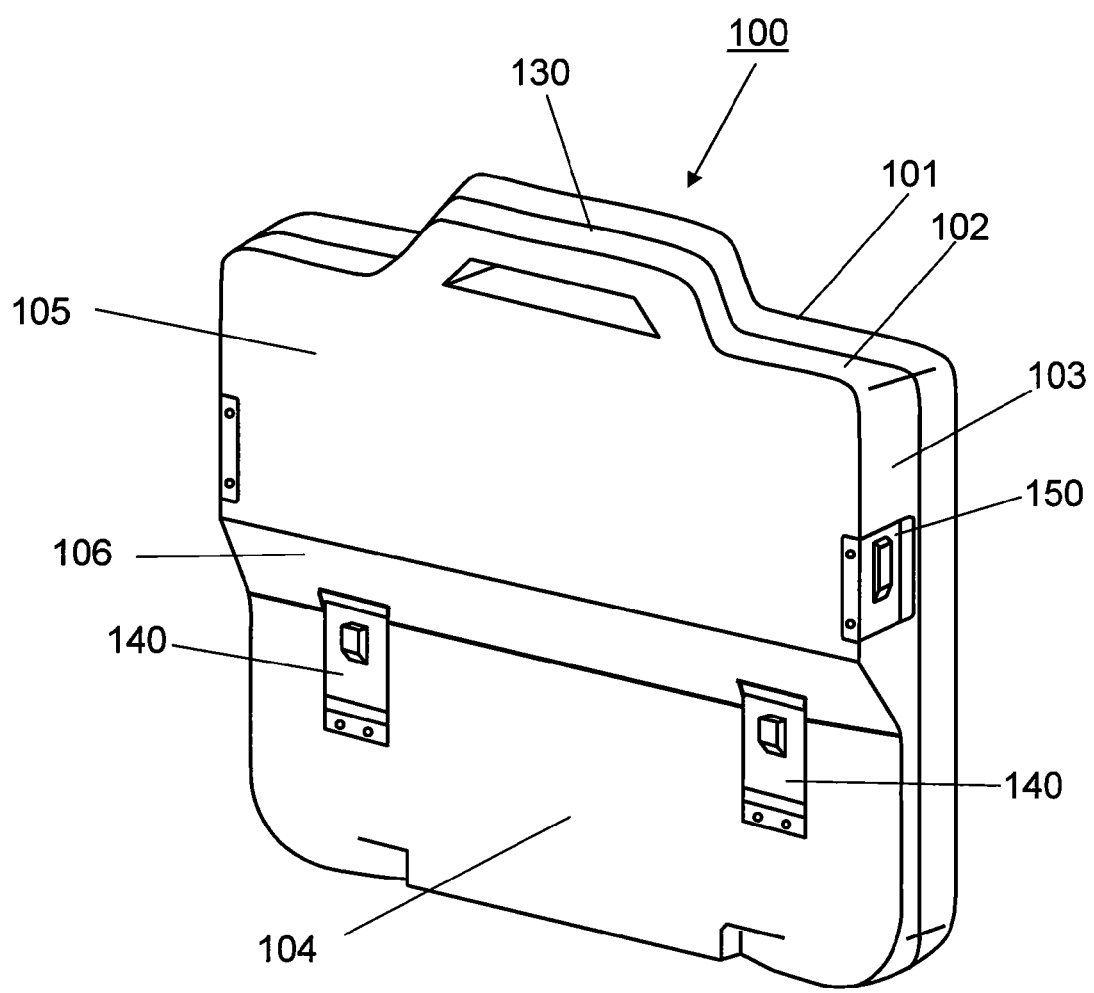
FIG. 2 is a perspective view from the back side of the NAVI.

FIG. 1 is a perspective view from the front side of an electronic device in accordance with a first exemplary embodiment of the present invention. FIG. 2 is a perspective view from the back side of the electronic device. The electronic device in accordance with the first exemplary embodiment is an information terminal that has a display section as an indication section and an operation button on its front side. The electronic device is applied to a portable navigation system (NAVI), for example. In the present embodiment of the present invention, a NAVI is described as an example of the electronic device.

NAVI 100 has front case section 101 molded of resin or the like and back case section 102. As shown in FIG. 1, front case section 101 includes display section 110 such as a liquid crystal display as an indication section for displaying visible information, and operation button 120 as a control button for controlling the visible information by menu selection or the like of the display screen. Front case section 101 is structured so that all operations of NAVI 100 are allowed on the front side. The upside of display section 110 has handle 130 in order to improve the portability of NAVI 100.

The inner space of back case section 102 has a battery storage section capable of holding a battery as a power supply of NAVI 100, for example, a recording medium storage section, and/or a storage section of a connection terminal to an external device such as a universal serial bus (USB). Back case section 102 has thin section 104 whose thickness is small, thick section 105 thicker than thin section 104, and step section 106 for interconnecting thin section 104 and thick section 105 through an inclined surface. These storage sections are sealed so as to keep the water proof, moisture proof, or dust proof with lid member 140 disposed on thin section 104 of back case section 102 and lid member 150 disposed astride thick section 105 and side section 103.

Electronic devices such as NAVI 100 are used very often not only in doors but also out of doors. Therefore, the electronic devices have been demanded to have vibration resistance and impact resistance against carrying or fall and have environmental resistance against temperature/humidity variation of an ambient environment. Recently, portable electronic devices including NAVI 100 have been more frequently used on the condition of a tough ambient environment such as the outdoors or construction sites. Therefore, all components of NAVI 100 such as front case section 101 and back case section 102, which constitute the NAVI 100 body, and operation button 120 are demanded to have a water proof structure, a moisture proof structure, and a dust proof structure.

Especially, each storage section disposed in the case of NAVI 100 of the first exemplary embodiment of the present invention is held in a state where an electrode terminal or the like is exposed in the storage section, so that intrusion of a droplet or dust causes corrosion or degradation of an electrode terminal or the like. Lid members 140 and 150 are demanded to have a strong lid function against vibration or impact, and perform certain water proof, moisture proof, and dust proof functions having environmental resistance against temperature/humidity variation or the like.

In the first exemplary embodiment of the present invention, a case where thin section 104 of back case section 102 has a storage section is described as an example.

Figure 3A:
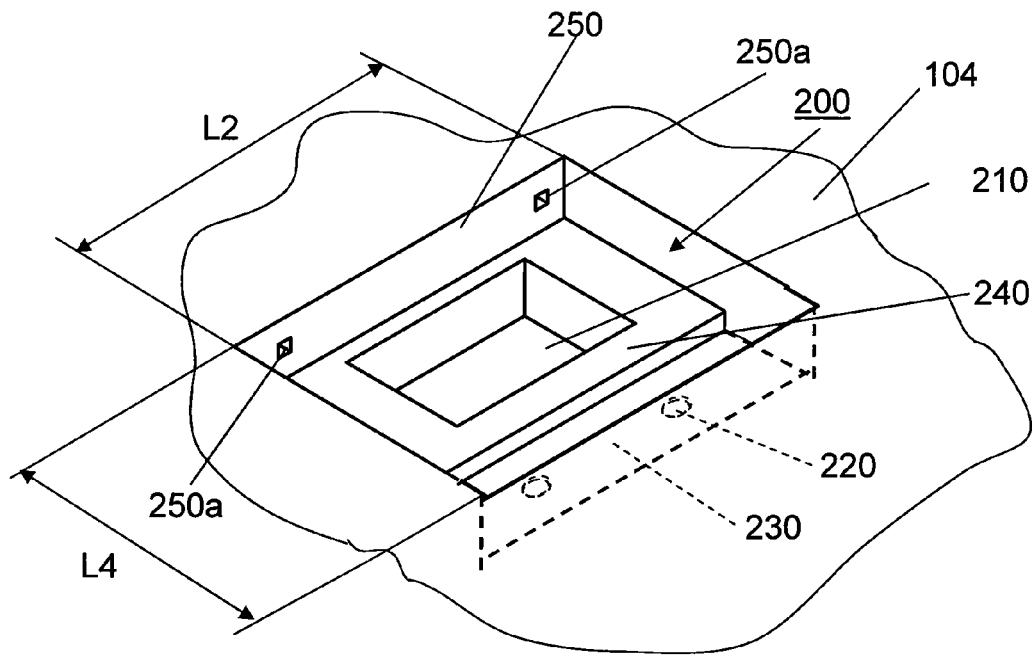
FIG. 3A is a perspective view showing a structure where an opening of a storage section of the NAVI is flat.
Figure 3B:
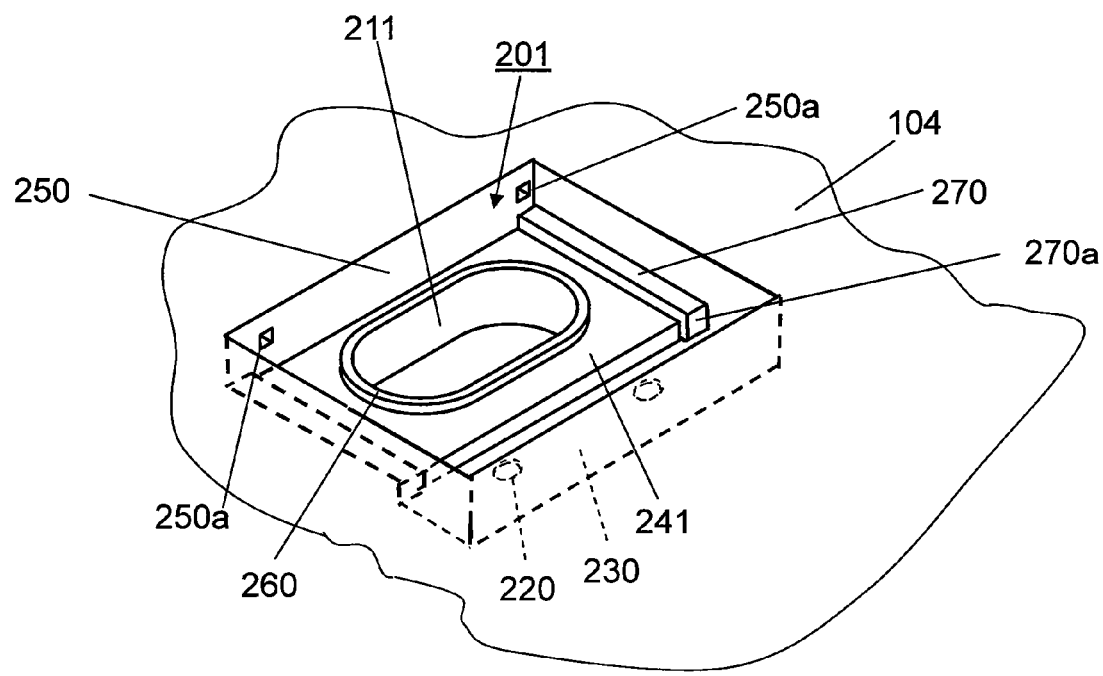
FIG. 3B is a perspective view showing a structure where a step is disposed in the opening of the storage section of the NAVI.

FIG. 3A and FIG. 3B are perspective views showing the structures of storage sections 200 and 201 of NAVI 100 in accordance with the first exemplary embodiment of the present invention. FIG. 3A is a perspective view showing an example where rectangular opening 210 is flat, and FIG. 3B is a perspective view showing an example where an elliptical opening 211 has a step.

As shown in FIG. 1, FIG. 2, FIG. 3A, and FIG. 3B, storage sections 200 and 201 are disposed in thin section 104 of back case section 102 of NAVI 100. Storage sections 200 and 201 have openings 210 and 211 inside them, respectively, and a connection terminal (not shown) such as a USB is exposed and disposed in openings 210 and 211. Lid member 140 is structured so as to seal storage sections 200 and 201. The sealed structure between lid member 140 and storage sections 200 and 201 is described later in detail.

Figure 4A:
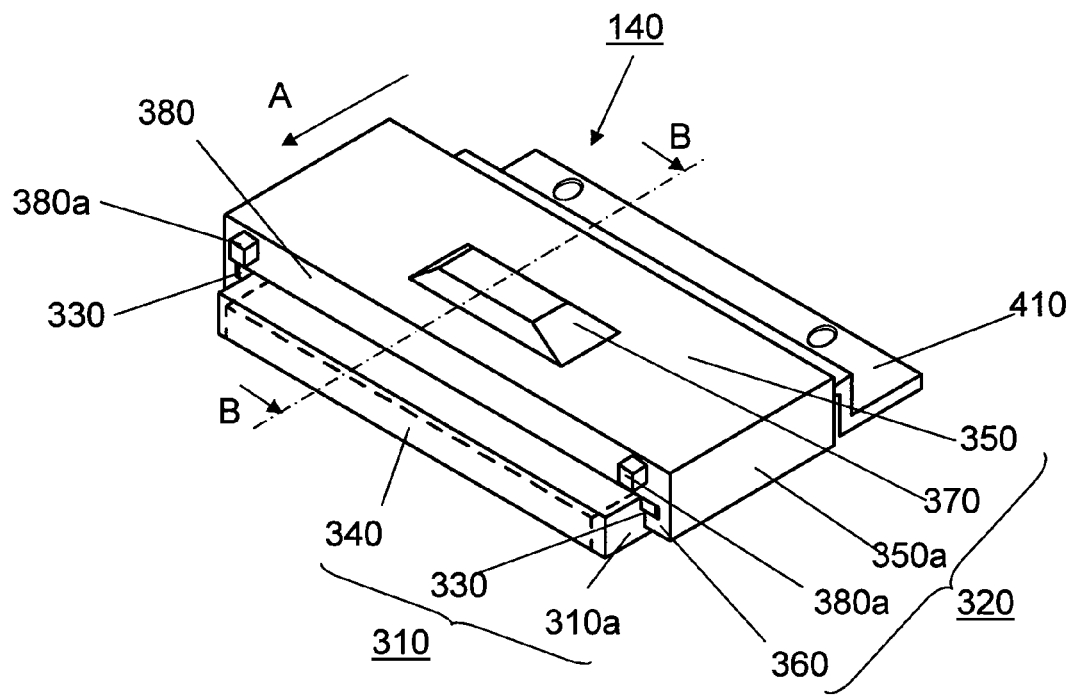
FIG. 4A is a perspective view showing a state before a lid member is fixed to the storage section in accordance with the first exemplary embodiment of the present invention.
Figure 4B:
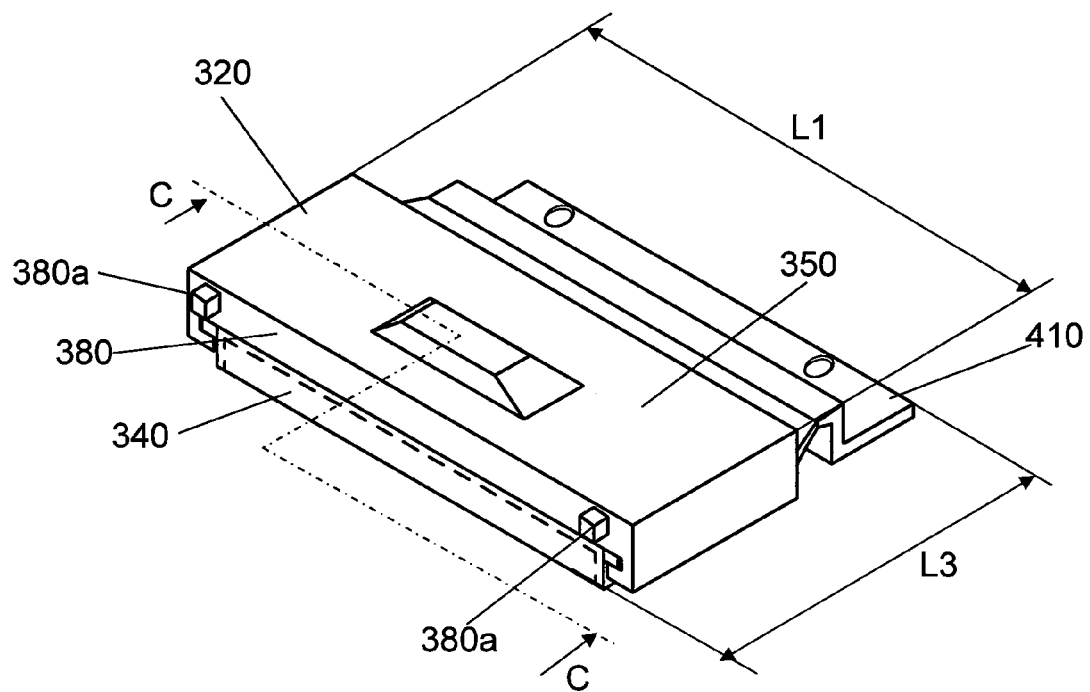
FIG. 4B is a perspective view showing a state where the lid member is fixed to the storage section.
Figure 5:
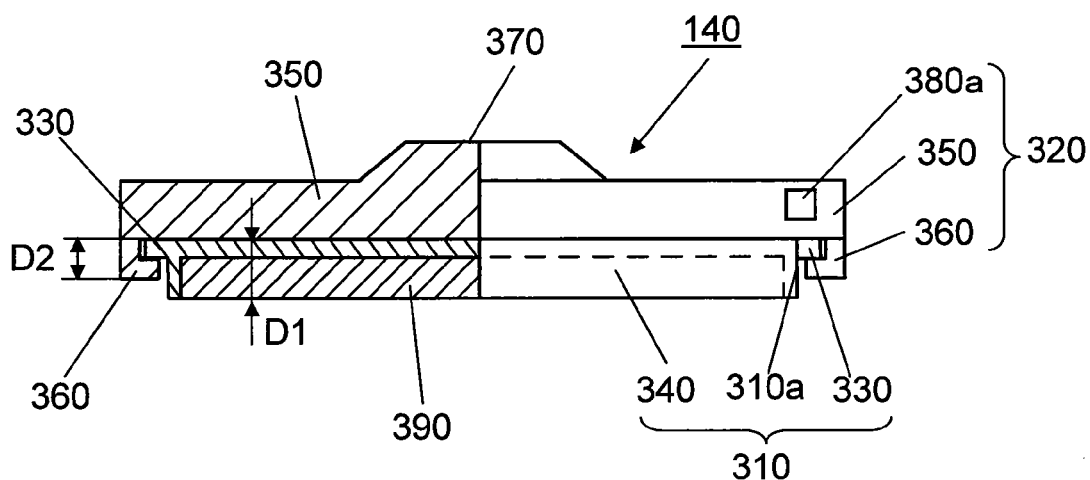
FIG. 5 is a sectional view taken in the line C-C of the lid member of FIG. 4B.

FIG. 4A and FIG. 4B are perspective views showing the detail of lid member 140 in accordance with the first exemplary embodiment of the present invention. FIG. 4A is a view showing a state before lid member 140 is fixed to storage section 200, and FIG. 4B is a view showing a state where lid member 140 is fixed to storage section 200. FIG. 5 is a sectional view taken in the line C-C of lid member 140 of FIG. 4B.

As shown in FIG. 4A, FIG. 4B, and FIG. 5, lid member 140 is formed of lid body 310 as the first lid member and lid latch 320 as the second lid member. In the first exemplary embodiment of the present invention, lid member 140 including lid body 310 and lid latch 320 is structured so as to have a substantially rectangular shape as a whole.

Lid body 310 includes tongue sections 330 as first engaging sections at both-side ends 310a, and lid element 340 as a first body. Lid latch 320 has latch section 350 as a second body structured so as to cover the whole surface of lid body 310, and key sections 360 as second engaging sections that are disposed at both-side ends 350a of latch section 350 and engage with tongue sections 330 of lid body 310.

In other words, lid body 310 is engaged with lid latch 320 with a predetermined clearance left in the following state: tongue sections 330 disposed at side ends 310a of lid body 310 engage with grooves of key sections 360 disposed in side ends 350a of lid latch 320, and lid latch 320 slides on the main surface of lid body 310 in the arrow A direction of FIG. 4A. Locking claw 370 for sliding lid latch 320 with a finger is disposed on the upper surface of latch section 350 of lid latch 320, and locking claw 370 facilitates sliding of lid latch 320 on lid body 310.

Projections 380a are disposed on end surface section 380 of lid latch 320 in the arrow A direction in which lid latch 320 slides. In the first exemplary embodiment of the present invention, a pair of projections 380a are disposed on both sides of end surface section 380 in parallel with the sliding surface on which lid latch 320 slides.

FIG. 4B shows the state where lid latch 320 slides on lid body 310 in the arrow A direction and lid member 140 is fixed to storage section 200. At this time, end surface section 380 of lid latch 320 abuts on end surface section 250 of storage section 200 described later. Therefore, end surface section 340a (refer to FIG. 6) of lid element 340 and end surface section 380 of lid latch 320 are disposed on substantially the same plane, and projections 380a disposed on lid latch 320 project from end surface section 340a of lid element 340.

As shown in FIG. 5, in the state where tongue sections 330 engage with grooves of key sections 360, thickness D1 of lid element 340 is set greater than thickness D2 from the lower surface of lid latch 320 to the upper end of the grooves of key sections 360. The surface of lid element 340 on the opposite side to the surface on which lid latch 320 slides has space, and the space is mounted with elastic member 390 such as rubber or resin.

Figure 6:
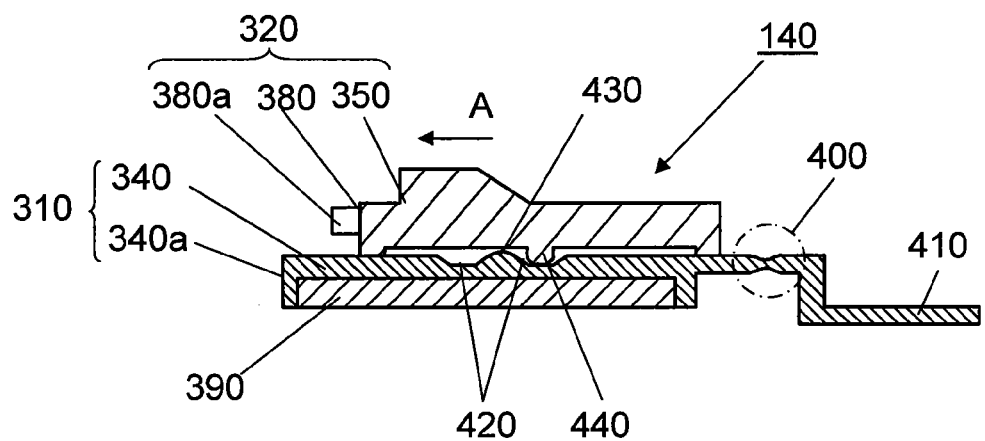
FIG. 6 is a sectional view taken in the line B-B of the lid member of FIG. 4A.

FIG. 5 is a sectional view taken in the line C-C of lid member 140 of FIG. 4B in accordance with the first exemplary embodiment of the present invention. FIG. 6 is a sectional view taken in the line B-B of lid member 140 of FIG. 4A in accordance with the first exemplary embodiment of the present invention. As shown in FIG. 5, lid latch 320 having projections 380a is disposed on lid body 310 slidably with respect to lid body 310. The end of lid body 310 on the opposite side to the surface having projections 380a of lid latch 320 is provided with hinge section 400 formed by thinning lid element 340, which forms lid body 310 by stretching or the like, so that the folding of lid element 340 is made easy. The tip of hinge section 400 has fixing section 410 for attaching and fixing lid member 140 to thin section 104 in back case section 102 of NAVI 100. Elastic member 390 that is made of rubber or resin and has a predetermined thickness is disposed inside the space on the opposite side to the surface of lid element 340 on which lid latch 320 slides, and is attached to lid element 340 by adhesion. At this time, when the lower end surface of elastic member 390 projects from the surrounding surface of lid element 340, elastic member 390 can be certainly crimped on lid body fixing surface 240 for example, as described later. Thus, high water-proof performance is obtained.

As shown in FIG. 6, projecting section 430 as a first projecting section is disposed on the surface of lid body 310 on which lid latch 320 slides, and recessed parts 420 are disposed on both sides of projecting section 430 in the surface of lid body 310 on which lid latch 320 slides. Projecting section 440 as a second projecting section engaging with recessed parts 420 is disposed on the surface of lid latch 320 on which lid body 310 slides. This structure allows positioning of the sliding of lid latch 320 and click feeling in the positioning when lid latch 320 is slid on lid body 310, and hence certain locking of lid member 140 can be recognized.

Figure 7A:
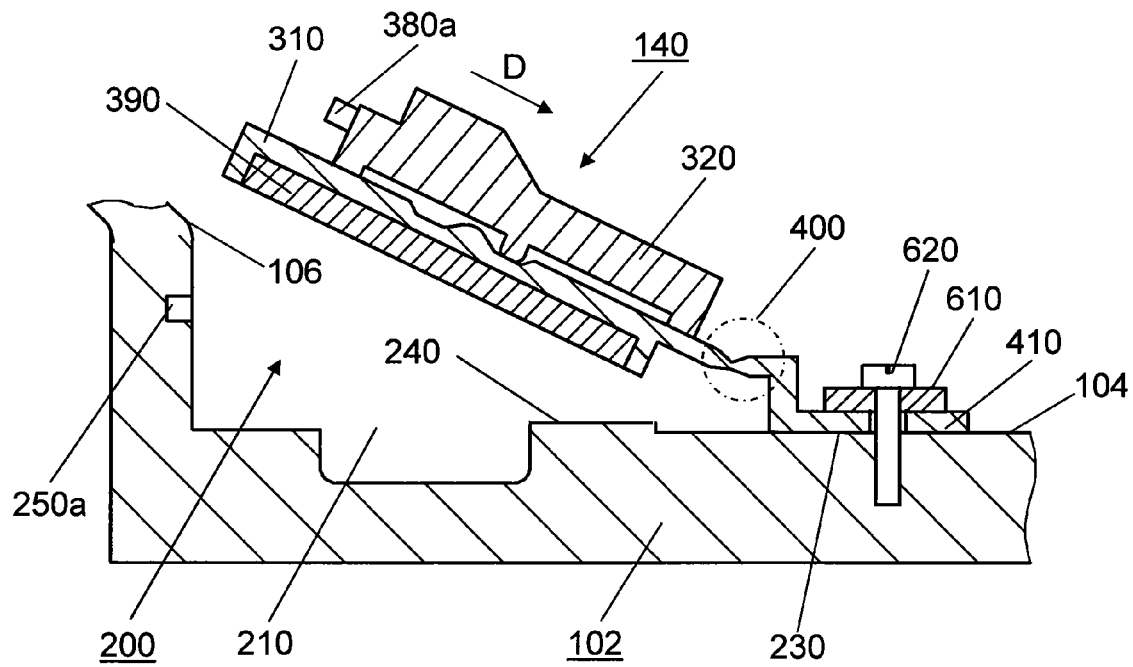
FIG. 7A is a sectional view showing a state before a lid is put on the storage section by the lid member in accordance with the first exemplary embodiment of the present invention.
Figure 7B:
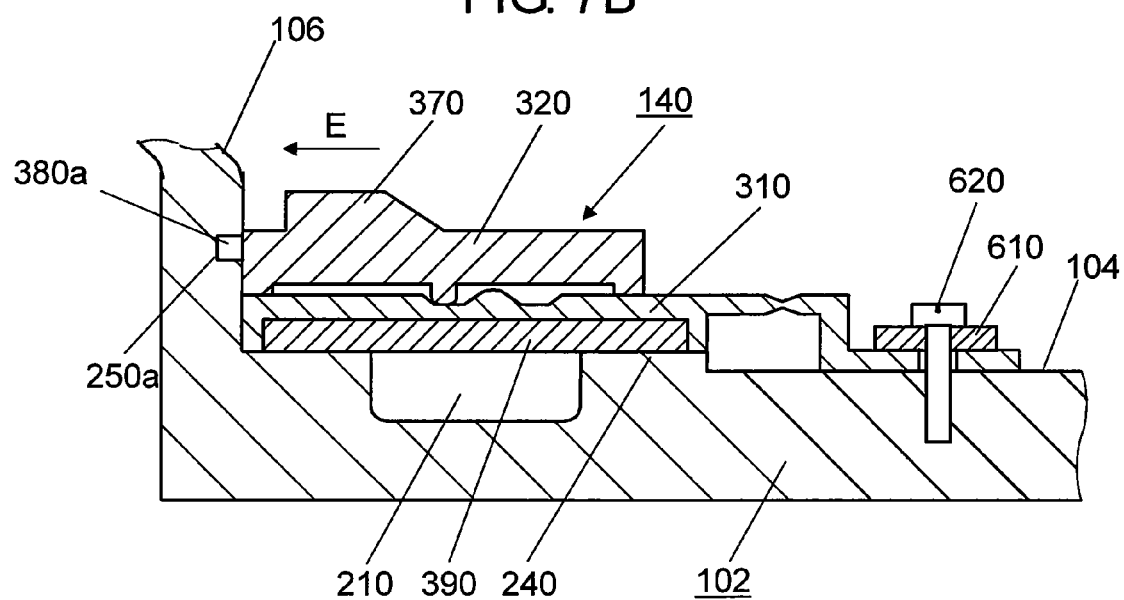
FIG. 7B is a sectional view showing a state where the lid is put on the storage section by the lid member.

A case where a lid is put on storage section 200 shown by FIG. 3A using lid member 140 in accordance with the first exemplary embodiment of the present invention is described. FIG. 7A and FIG. 7B are sectional views showing a state where a lid is put on storage section 200 with lid member 140 described in the first exemplary embodiment. FIG. 7A shows the state where lid member 140 is opened, and FIG. 7B shows the state where the lid is put on storage section 200 with lid member 140.

The structure of storage section 200 of FIG. 3A is described in more detail. As shown in FIG. 3A, opening 210 is disposed inside storage section 200, and a connection terminal such as a USB and a battery stored in storage section 200 are exposed and disposed in openings 210. Storage section 200 has fixing step section 230 having screw hole sections 220 for fixing section 410 of lid body 310, and lid body fixing surface 240 engaging with lid body 310. End surface section 250 is disposed on the opposite side of storage section 200 to fixing step section 230 so that end surface section 340a of lid element 340 come into contact with end surface section 380 of lid latch 320 through a plane. Engaging holes 250a engaging with projections 380a disposed on lid latch 320 of lid member 140 are disposed in end surface section 250 correspondingly to the positions of projections 380a.

In the first exemplary embodiment of the present invention, the case where lid member 140 is structured to have a substantially rectangular shape as a whole is described, storage section 200 has a rectangular recessed part as a whole, and lid member 140 engages with the recessed part. Therefore, length L1 of lid member 140 of FIG. 4B is substantially equal to length L2 of the recessed part of FIG. 3A, and width L3 of lid member 140 of FIG. 4B is substantially equal to width L4 of the recessed part of FIG. 3A.

As shown in FIG. 7A, fixing section 410 of lid body 310 in lid member 140 is fixed to fixing step section 230 of storage section 200 through screw 620 or the like using attaching member 610. In this state, hinge section 400 of lid body 310 is folded, sealing of lid member 140 and storage section 200 is opened, and an external terminal such as a USB is allowed to be connected to a connection terminal (not shown) in opening 210 of storage section 200.

At this time, lid latch 320 of lid member 140 has been slid in the arrow D direction with respect to lid body 310.

While, FIG. 7B shows a state in which storage section 200 is closed by lid member 140. In other words, lid member 140 is pressed on the opening 210 side of storage section 200, lid member 140 engages with storage section 200, and elastic member 390 of lid body 310 abuts on lid body fixing surface 240.

In this state, lid latch 320 is moved in the arrow E direction by locking claw 370 of lid latch 320. At this time, key sections 360 of lid latch 320 are guided and slid by tongue sections 330 of lid body 310, and slide on lid body 310 to easily slide lid latch 320 in the arrow E direction.

As a result, projections 380a disposed on lid latch 320 engage with engaging holes 250a disposed in end surface section 250 of storage section 200, thereby fixing lid latch 320 of lid member 140 to storage section 200. At this time, lid latch 320 can be slid while whole lid member 140 is pressed and elastic member 390 is deformed. Therefore, projections 380a can be engaged with engaging holes 250a even when the vertical positions of engaging holes 250a are set slightly lower than those of projections 380a. As a result, after projections 380a engage with engaging holes 250a, the sealing force between lid body fixing surface 240 and elastic member 390 is increased using an elastic force of elastic member 390, and bonding of lid member 140 to connection terminal storage section 200 can be made firm.

Therefore, when the impact by vibration or fall is applied to NAVI 100, engaging of storage section 200 with lid member 140 is not released, and a certain sealing function can be secured.

Thus, in lid member 140 of the first exemplary embodiment of the present invention, tongue sections 330 disposed in lid body 310 of lid member 140 are gripped by the grooves of key sections 360 disposed in lid latch 320, and lid body 310 can be uniformly pressed by lid latch 320. Therefore, the whole region of opening 210 can be uniformly sealed by elastic member 390 of lid body 310, and NAVI 100 having lid member 140 having extremely high water proof, moisture proof, and dust proof performance can be achieved.

In this gripping structure, tongue sections 330 disposed at both ends of lid body 310 engage with key sections 360 disposed at both ends of lid latch 320. This gripping structure can be achieved by extremely small number of components.

Since projections 380a disposed on lid latch 320 are engaged with engaging holes 250a disposed in back case section 102 of NAVI 100, a certain locking function can be secured that is resistant to the impact by vibration or fall and prevents the engagement of lid member 140 from being easily released.

Lid body 310 and lid latch 320 are disposed slidably with a predetermined clearance left. Therefore, even when materials of lid element 340 of lid body 310 and lid latch 320 are different from each other, they are not affected by their expansion/contraction due to the ambient environment such as temperature/humidity variation. As a result, sealing, opening, closing operations of storage section 200 and lid member 140 can be certainly performed.

In NAVI 100 of the first exemplary embodiment of the present invention, thickness D1 of lid element 340 is set greater than thickness D2 of the state where key sections 360 are locked to tongue sections 330, and the surface of lid element 340 on the opposite side to the surface on which lid latch 320 slides is mounted with elastic member 390 such as rubber or resin. Therefore, elastic member 390 can be certainly butted on lid body fixing surface 240 having opening 210 of NAVI 100, thereby achieving a certain sealing function.

Next, the structure of storage section 201 of FIG. 3B is described. This structure of storage section 201 of FIG. 3B differs from the structure of storage section 200 of FIG. 3A in the following components. Opening 211 has an elliptic shape, and elastic-member fixing step section 260 that is projected higher than lid body fixing surface 241 and is stuck to elastic member 390 is formed around opening 211. Latch sliding step sections 270 on which the bottom sections of key sections 360 of lid latch 320 slide are disposed on both sides of lid body fixing surface 241. Engaging holes 250a or the like engaging with projections 380a disposed on end surface section 380 of lid latch 320 have the same structure as that of FIG. 3A.

In this structure, when lid latch 320 slides on lid body 310, the bottom sections of key sections 360 of lid latch 320 can be certainly slid along latch sliding step sections 270, and elastic-member fixing step section 260 disposed around opening 211 allows firmer adhesion to elastic member 390.

In the first exemplary embodiment of the present invention, opening 211 has the elliptic shape, and elastic-member fixing step section 260 is formed around it. However, the shape of opening 211 is not always required to be an ellipse, but the shape may be a rectangle or circle when elastic-member fixing step section 260 is formed.

Elastic-member fixing step section 260 can improve the adhesion by elastic member 390 disposed in the space that is formed in the surface of lid element 340 on the opposite side to the surface on which lid latch 320 slides. Elastic-member fixing step section 260 can be made of the same resin material as lid body fixing surface 241, or elastomeric material such as rubber having sealing property.

In FIG. 3B, end surface sections 270a of latch sliding step sections 270 are projected higher than the end surface of lid body fixing surface 241 that faces end surface section 250. End surface sections 270a can be formed between lid body fixing surface 241 and end surface section 250, but a gap is apt to occur between the end surface section of lid body fixing surface 241 and end surface sections 270a. Therefore, from the viewpoint of water proof performance, preferably, end surface sections 270a are disposed between the surface facing end surface section 250 through lid body fixing surface 241 and the end surface section of lid body fixing surface 241.

Lid body 310 and lid latch 320 constituting lid member 140 can be easily formed by molding of resin. At this time, when lid body 310 is made of a resin material having elasticity and lid latch 320 gripping lid body 310 is made of a material having rigidity, a more desirable structure can be obtained as lid member 140.

(Second Exemplary Embodiment)

Figure 8:
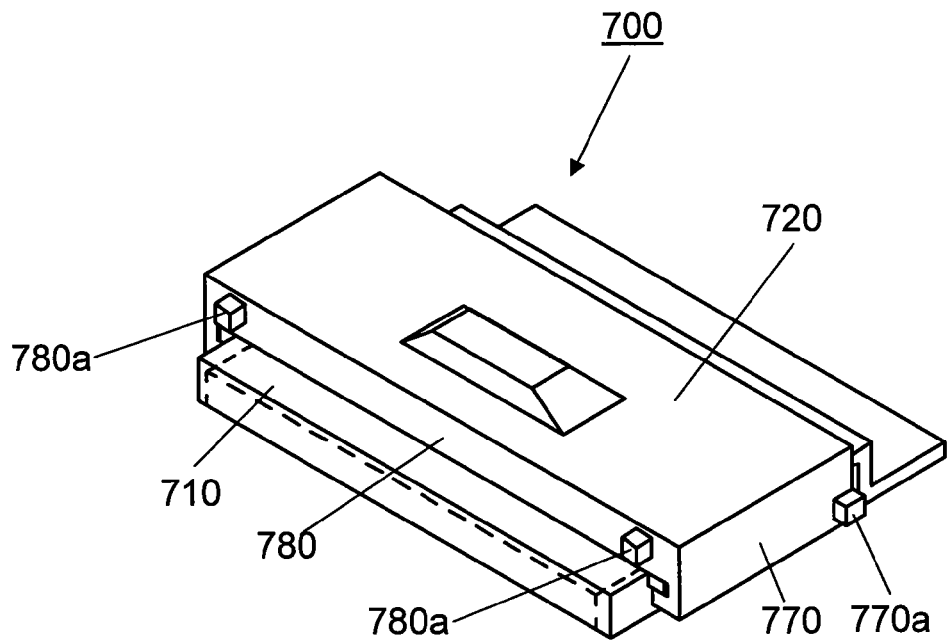
FIG. 8 is a perspective view showing a detail of a lid member in accordance with a second exemplary embodiment of the present invention.
Figure 9:
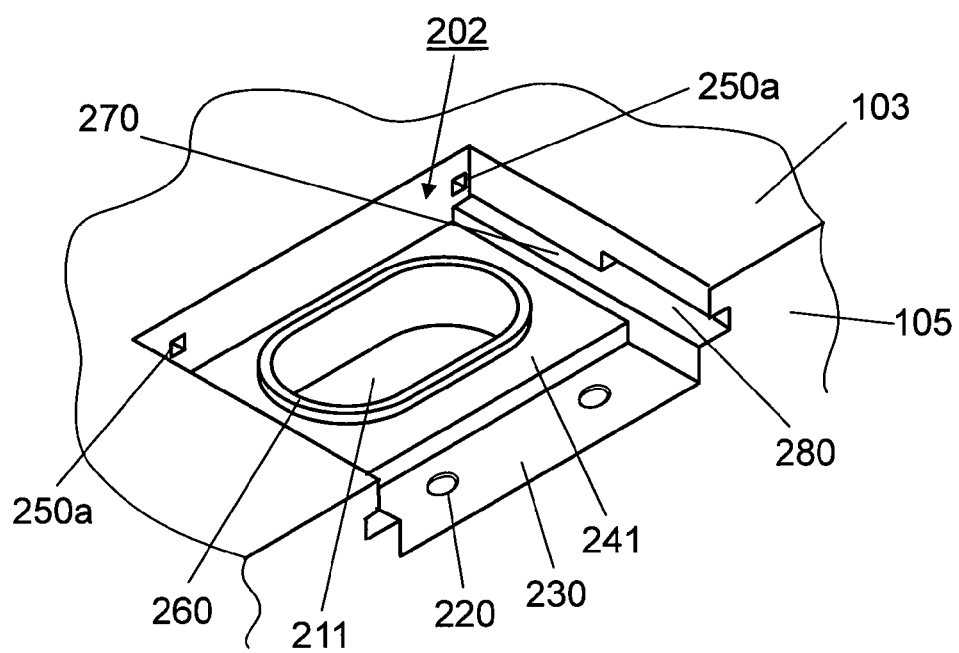
FIG. 9 is a perspective view showing a structure of a storage section of a NAVI in accordance with the second exemplary embodiment.

FIG. 8 is a perspective view showing a detail of lid member 700 in accordance with a second exemplary embodiment of the present invention. FIG. 9 is a perspective view showing a structure of storage section 202 in accordance with the second exemplary embodiment. As shown in FIG. 8, the basic structure of lid member 700 of the second exemplary embodiment is similar to that of the first exemplary embodiment in FIG. 4A and FIG. 4B. In the second exemplary embodiment, however, storage section 202 is disposed at the position of lid member 150 of FIG. 1 and FIG. 2, and the structure of lid latch 720 is different from that in the first exemplary embodiment.

In other words, as shown in FIG. 8, lid member 700 of the second exemplary embodiment has two projections 780a disposed on end surface section 780 of the sliding direction of lid latch 720, and second projections 770a are disposed on both end surface sections 770 orthogonal to the sliding direction of lid latch 720 with respect to lid body 710. In lid latch 720, projections 780a and second projections 770a are disposed at positions on a substantially diagonal line of the surface of lid latch 720.

Storage section 202 engaging with lid member 700 has the same structure as that of FIG. 3B of the first exemplary embodiment, but engaging grooves 280 are additionally formed at positions corresponding to second projections 770a on both sides of latch sliding step sections 270.

In the structures of lid member 700 and storage section 202, when storage section 202 is sealed by lid member 700, projections 780a of lid latch 720 are engaged with engaging holes 250a of storage section 202, second projections 770a of lid latch 720 are engaged with engaging grooves 280 of storage section 202, and four corners of lid latch 720 are firmly fixed to four corners of storage section 202. As a result, the whole region of opening 211 of storage section 202 can be uniformly sealed by lid body 710 while lid body 710 is gripped by lid latch 720.

Since the number of fixing points of lid member 700 to NAVI 100 increases, firmer fixing against an impact applied to NAVI 100 can be achieved. The water proof, moisture proof, and dust proof functions of lid member 700 can be therefore more certainly achieved even on an environmental condition undergoing the impact.

The shapes of projections 780a and second projections 770a can be set arbitrarily. In consideration of degree of freedom in opening/closing of lid member 700, however, it is desired to increase the contact area with engaging holes 250a and engaging grooves 280 disposed in connection terminal storage section 202 as much as possible.

The shapes of projections 780a and second projections 770a may be tapered shapes having a tip in the direction engaging with engaging holes 250a and engaging grooves 280. Further, engaging holes 250a and engaging grooves 280 may have a tapered shape.

(Third Exemplary Embodiment)

Figure 10A:
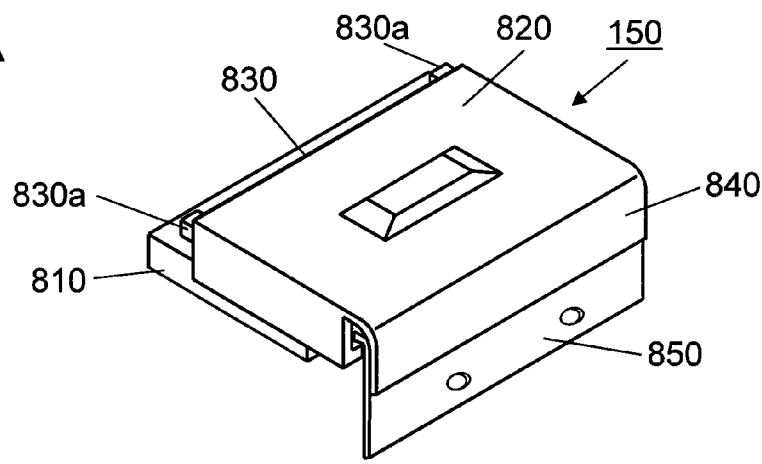
FIG. 10A is a perspective view showing a structure of a lid member in accordance with a third exemplary embodiment of the present invention.
Figure 10B:
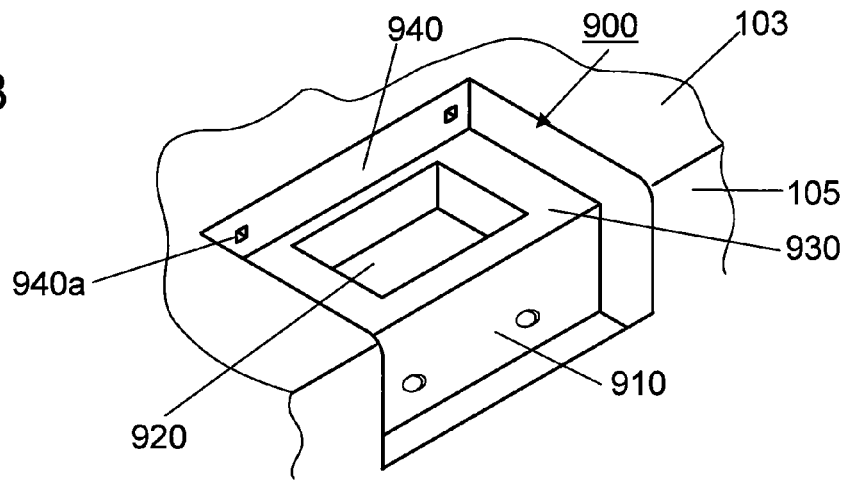
FIG. 10B is a perspective view showing a structure of a storage section of a NAVI in accordance with the third exemplary embodiment of the present invention.
Figure 10C:
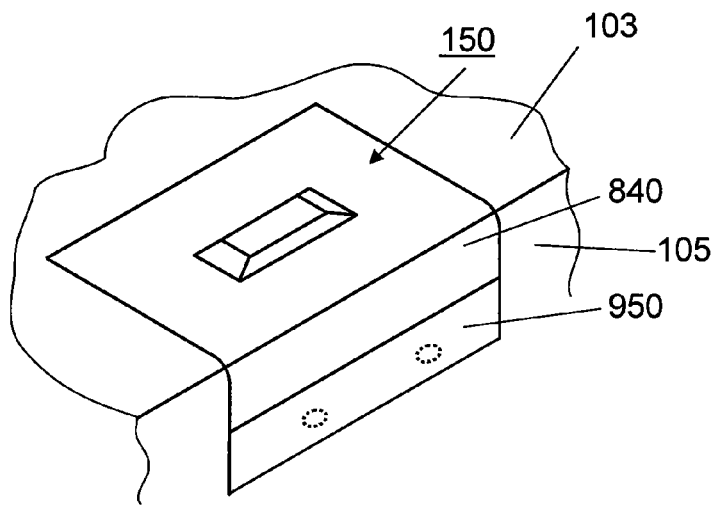
FIG. 10C is a perspective view showing a state where a lid is put on the storage section by the lid member.

FIG. 10A, FIG. 10B, and FIG. 10C are perspective views showing lid member 150 and a structure of storage section 900 of NAVI 100 using it in accordance with a third exemplary embodiment of the present invention. FIG. 10A is a perspective view of lid member 150, FIG. 10B is a perspective view showing the structure of storage section 900, and FIG. 10C is a perspective view showing a state where a lid is put on storage section 900 by lid member 150.

Lid member 150 and storage section 900 of the third exemplary embodiment are appropriate when they are disposed astride thick section 105 and side section 103 of back case section 102 of NAVI 100 or when they are disposed astride thin section 104 and side section 103, especially as shown in FIG. 1 and FIG. 2. As the third exemplary embodiment of the present invention, however, lid member 150 disposed astride thick section 105 and side section 103 is described as an example. The storage section is appropriate to a connection terminal storage section as a USB terminal or a battery storage section applied to the power supply of NAVI 100.

The basic structure of lid member 150 of the third exemplary embodiment differs from those of the first and second exemplary embodiments in the following points. The structure of a fixing section for fixing lid body 810 of lid member 150 to the case of NAVI 100 differs from those of the first and second exemplary embodiments. As shown in FIG. 10A, cover section 840 that expands from lid latch 820 and is folded along the shape of side section 103 of NAVI 100, for example, is disposed on the opposite side to end surface section 830 of lid latch 820 that has projections 830a. Fixing section 850 of lid body 810 is also expanded from lid body 810, and is folded so as to be inside lid latch 820.

FIG. 10B shows the structure of connection terminal storage section 900 on which a lid is put by such lid member 150. The basic structure is similar to FIG. 3B described in the first exemplary embodiment, and differs from FIG. 3B in that fixing step section 910 for fixing lid member 150 is formed substantially rectangularly to lid body fixing surface 930 having opening 920. Engaging holes 940a formed in end surface section 940 are disposed at positions at which projections 830a are engaged with them when lid member 150 is fixed to storage section 900 and the lid is put on it.

FIG. 10C shows the state where lid member 150 having the above-mentioned structure is fixed to storage section 900 and the lid is put on it, and projections 830a of lid latch 820 are engaged with engaging holes 940a of lid body 810. At this time, second cover section 950 for covering over fixing section 850 of lid body 810 fixed to fixing step section 910 is also disposed.

In lid member 150 of the third exemplary embodiment of the present invention, lid body 810 and lid latch 820 have a shape along the corner of back case section 102 of FIG. 1 and FIG. 2. Therefore, sense of unity of lid member 150 and the case of NAVI 100 can be easily obtained, a sealing function as a lid function is secured, and NAVI 100 having good appearance can be provided.

Such lid members of the exemplary embodiments of the present invention can be easily achieved only by molding of a resin material. Therefore, using the elastic force of the resin material also allows the securement of the sealing property between the opening and the lid body, the elastic fixing of the projection to the engaging hole disposed in the case, and the achievement of a lid member having high impact resistance and high environmental resistance against temperature variation or the like.

In the exemplary embodiments of the present invention, a NAVI has been described as an electronic device. However, the exemplary embodiments can be applied to not only the NAVI but also an electronic device such as a personal digital assistant (PDA), a game machine, a portable phone, a nursing apparatus, a notebook computer, and a camera.

What is claimed is:

1. An electronic device comprising:
   a case section including a storage section and an engaging hole; and
   a lid body opening and closing a part of the case section, one end of the lid body is attached to the case section;
   a lid latch configured to slide on a surface of the lid body in a direction away from the one end of the lid body and engage the engaging hole with an engaging portion when positioned in a direction away from the one end of the lid body to close the part of the case section; and
   an elastic member disposed between the case section and the lid body, the elastic member sealing the storage section of the case section when the lid latch is in a closed position.

2. The electronic device of claim 1, wherein the lid body abuts the elastic member when the lid latch engages the engaging hole with the engaging portion.

3. The electronic device of claim 1, wherein
   the lid body includes a plurality of recessed parts,
   the lid latch includes a projection section, and
   the projection section is configured to engage with a first one of the plurality of recessed parts and to engage with a second one of the plurality of recessed parts in response to the sliding of the lid latch.

4. The electronic device of claim 1, wherein the storage section includes an opening therein, and the elastic member surrounds the opening in plan view when the lid latch is in a closed position.

5. The electronic device of claim 1, wherein the storage section includes an opening therein, and a connection terminal is disposed in the opening.

6. The electronic device of claim 1, wherein the storage section includes an opening therein, and a battery terminal is disposed in the opening.

7. The electronic device of claim 1, wherein the elastic member fully covers an opening in the storage section.

8. An electronic device comprising:
   a case section including an opening section, an engaging hole disposed on an inside wall surface of the opening section and an opening;
   a lid body opening and closing the opening section, one end of the lid body is attached to the case section;
   a lid latch configured to slide on a surface of the lid body in a direction away from the one end of the lid body and engage the engaging hole with an engaging portion when positioned in a direction away from the one end of the lid body to close the opening; and
   an elastic member disposed between the case section and the lid body, the elastic member sealing the opening section of the case section when the lid latch is in a closed position.

9. The electronic device of claim 8, wherein a storage section includes an opening therein, and the elastic member surrounds the opening in plan view when the lid latch is in a closed position.

10. The electronic device of claim 8, wherein a storage section includes an opening therein, and a connection terminal is disposed in the opening.

11. The electronic device of claim 8, wherein a storage section includes an opening therein, and a battery terminal is disposed in the opening.

12. The electronic device of claim 8, wherein the elastic member fully covers an opening in a storage section.

* * * * *